(12) United States Patent
Blakey et al.

(10) Patent No.: US 8,806,304 B2
(45) Date of Patent: *Aug. 12, 2014

(54) REDUCING PROCESSING COMPLEXITY AND COST ASSOCIATED WITH A SOFT FORWARD ERROR CORRECTION (FEC) OPERATION

(75) Inventors: Stanley H. Blakey, Kanata (CA); Alexander Kaganov, Toronto (CA)

(73) Assignee: Infinera Corporation, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/435,847

(22) Filed: Mar. 30, 2012

(65) Prior Publication Data

US 2013/0262954 A1     Oct. 3, 2013

(51) Int. Cl.
*H03M 13/00*     (2006.01)

(52) U.S. Cl.
USPC .......................................... 714/776; 714/752

(58) Field of Classification Search
CPC ..................................................... H03M 13/05
See application file for complete search history.

(56) References Cited

PUBLICATIONS

D. Chase: "A Class of Algorithms for Decoding Block Codes With Channel Measurement Information"; IEEE Transactions on Information Theory, vol. IT-18, No. 1, Jan. 1972, 13 pages.

R. Pyndiah et al.: "Near Optimum Decoding of Product Codes"; Telecom Bretagne, IEEE 1994, 5 pages.
R. Pyndiah: "Near-Optimum Decoding of Product Codes: Block Turbo Codes"; IEEE Transactions on Communications, vol. 46, No. 8, Aug. 1998; 8 pages.
Knuth, "The Art of Computer Programming", Second Edition, vol. 3—Sorting and Searching, Stanford University, 780 pages, 1998.
Lin et al., "Error Control Coding: Fundamentals and Applications", Prentice-Hall Computer Applications in Electrical Engineering Series, 603 pages, 1983.

*Primary Examiner* — Guerrier Merant
(74) *Attorney, Agent, or Firm* — Harrity & Harrity LLP; David L. Soltz

(57) ABSTRACT

A system is configured to receive a word on which to perform forward error correction; identify least reliable positions that correspond to encoded bits, within the word, associated with a lowest level of reliability; generate candidate words based on different combinations of inverted encoded bits; identify a pair of candidate words that includes a candidate word and another candidate word, the candidate word includes an inverted most reliable bit of the encoded bits within the candidate word; identify a quantity of errors within the candidate word; determine whether the quantity of errors corresponds to an odd value; invert a parity bit associated with the candidate word when the quantity of errors corresponds to the odd value; select the other candidate word when the parity bit is inverted; and perform forward error correction, on the word, using the other candidate word based on selection of the other candidate word.

20 Claims, 10 Drawing Sheets

| CANDIDATE WORD ID 605 | FIRST LRP 610 | SECOND LRP 615 | THIRD LRP 620 | LRP ERROR 625 | NON-LRP ERROR 630 | PARITY INVERT 635 |
|---|---|---|---|---|---|---|
| 00 | 0 | 0 | 0 | 0 | 2 | 0 |
| 01 | 1 | 0 | 0 | 1 | 2 | 1 |
| 02 | 0 | 1 | 0 | 1 | ≤2 | 1 or 0 |
| 03 | 1 | 1 | 0 | 2 | >2 | |
| 04 | 0 | 0 | 1 | 1 | 2 | 1 |
| 05 | 1 | 0 | 1 | 2 | 2 | 0 |
| 06 | 0 | 1 | 1 | 2 | 2 | 0 |
| 07 | 1 | 1 | 1 | 3 | 2 | 1 |

FIG. 6

| CANDIDATE WORD ID 605 | FIRST LRP 610 | SECOND LRP 615 | THIRD LRP 620 | NON-LRP ERROR QUANTITY 630 | ROUND ONE SELECTION 805 | ROUND TWO SELECTION 810 |
|---|---|---|---|---|---|---|
| 00 | 0 | 0 | 0 | 2 | 1 | 1 |
| 01 | 1 | 0 | 0 | 2 | 1 | 0 |
| 02 | 0 | 1 | 0 | ≤2 | 1 | 1 |
| 03 | 1 | 1 | 0 | >2 | 0 | |
| 04 | 0 | 0 | 1 | 2 | 1 | 1 |
| 05 | 1 | 0 | 1 | ≤2 | 1 | 0 |
| 06 | 0 | 1 | 1 | 2 | 1 | 1 |
| 07 | 1 | 1 | 1 | >2 | 0 | |

FIG. 8

| CANDIDATE WORD ID 605 | FIRST LRP 610 | SECOND LRP 615 | THIRD LRP 620 | LRP ERROR QUANTITY 625 | NON-LRP ERROR QUANTITY 630 | DISTANCE 1005 | SELECTION 1010 |
|---|---|---|---|---|---|---|---|
| 00 | 0 | 0 | 0 | 0 | 0 or 1 | 0 or 1 | 1 |
| 01 | 1 | 0 | 0 | 1 | 0 | 1 | Duplicate of 00 |
| 02 | 0 | 1 | 0 | 1 | 0 | 1 | Duplicate of 00 |
| 03 | 1 | 1 | 0 | 2 | 0 | 2 | Duplicate of 00 |
| 04 | 0 | 0 | 1 | 1 | 0 | 1 | Duplicate of 00 |
| 05 | 1 | 0 | 1 | 2 | 0 | 2 | Duplicate of 00 |
| 06 | 0 | 1 | 1 | 2 | 0 | 2 | Duplicate of 00 |
| 07 | 1 | 1 | 1 | 3 | 2 | >2 | 1 |

REDUCING PROCESSING COMPLEXITY AND COST ASSOCIATED WITH A SOFT FORWARD ERROR CORRECTION (FEC) OPERATION

BACKGROUND

In an increasingly networked world, more and more traffic, such as data, voice, and video, is transmitted over public and proprietary networks. The networks use high data rates (e.g., greater than 10 gigabits per second (Gbps)) to transport greater quantities of traffic. Certain types of the networks, such as optical networks, use complex signal processing to achieve the high data rates. The complex signal processing may be performed using forward error correction (FEC) devices that use soft iterative error correction techniques to reduce a quantity of errors, within the traffic, to a level that is specified by the public and proprietary networks.

The soft iterative error correction techniques may enable a FEC device to identify least reliable positions (LRPs), corresponding to encoded bits, within an encoded word associated with the traffic. The LRPs may be used, by the FEC device, to generate candidate words (e.g., $2^N$ candidate words, where N represents a quantity of LRPs). Increasing a quantity of LRPs may increase a quantity of errors that can be identified or corrected by the FEC device. However, increasing the quantity of LRPs, by a single LRP, may cause a doubling of the quantity of candidate words (e.g., from 16, when N=4, to 32 when N=5) to be generated for processing the same amount of traffic. The doubling of the quantity of candidate words may increase costs or processing complexity (e.g., by increasing processing steps, processing time, memory usage, processing capacity, etc.) associated with processing the traffic.

SUMMARY

According to one implementation, a system may include one or more devices to receive a word, of a block of words within traffic, on which to perform forward error correction. Each word, of the block of words, may include respective encoded bits and respective sets of reliability bits for identifying a respective level of reliability of each one of the respective encoded bits. The one or more devices may be to: identify, within the word, least reliable positions that correspond to a subset of encoded bits associated with one or more lowest levels of reliability; generate a set of candidate words based on different combinations in which the subset of encoded bits can be inverted; and determine a first quantity of errors associated with a first candidate word of the set of candidate words and a second quantity of errors associated with a second candidate word of the set of candidate words. The one or more devices may also be to: determine whether the first quantity of errors or the second quantity of errors corresponds to an odd value; invert a parity bit, associated with the second candidate word, when the second quantity of errors corresponds to the odd value; and determine, based on inverting the parity bit, whether a first bit or a second bit is inverted, the first bit being most reliable among the subset of encoded bits within the first candidate word, and the second bit being most reliable among the subset of encoded bits within the second candidate word. The one or more devices may further be to: select the first candidate word when the second bit is inverted; and perform forward error correction on the word, using the first candidate word, based on the selection of the first candidate word.

According to another implementation, a method may include receiving, from an optical receiver and by a device, a word, of a block of words within traffic, on which to perform forward error correction. Each word, of the block of words, may include respective encoded bits and respective sets of reliability bits for identifying a respective level of reliability of each one of the respective encoded bits. The method may also include identifying, by the device, least reliable positions, within the word, that correspond to a subset of encoded bits, within the word, associated with one or more lowest levels of reliability; generating, by the device, a set of candidate words based on different combinations in which the subset of encoded bits can be inverted; and identifying, by the device, a first pair of candidate words, within the set of candidate words, where the first pair of candidate words may include a first word and a second word. The first word may include a first bit, where the first bit may not be an inverted bit and may be most reliable within the subset of encoded bits associated with the first word. The method may further include identifying, by the device, a first quantity of errors associated with the first word and a second quantity of errors associated with the second word; determining, by the device, whether the first quantity of errors is greater than the second quantity of errors; and selecting, by the device, the first word when the first quantity of errors is not greater than the second quantity of errors. The method may also include identifying, by the device, a second pair of candidate words, within selected words of the set of the candidate words, where the second pair may include the first word and a third word, and where the third word may include a second bit that is most reliable within the subset of encoded bits associated with the third word; determining, by the device, whether the second bit is an inverted bit; selecting, by the device, the first word when the second bit is an inverted bit; and performing, by the device, forward error correction on the word using the first word based on selection of the first word.

According to a further implementation, a device may include one or more components to: receive a word, of a block of words within traffic, on which to perform forward error correction. Each word of the block of words may include respective encoded bits and respective sets of reliability bits for identifying a respective level of reliability of each one of the respective encoded bits. The one or more components may also be to: identify, within the word, least reliable positions that correspond to a subset of encoded bits associated with one or more lowest levels of reliability; generate a set of candidate words based on different combinations in which the subset of encoded bits can be inverted; and identify a first pair of words of the set of candidate words, where the first pair may include a first candidate word and a second candidate word. The first candidate word may include a most reliable bit, of the subset of encoded bits associated with the first candidate word, that is not inverted. The one or more components may further be to: identify a quantity of errors associated with the first candidate word; determine whether the quantity of errors corresponds to an odd value; invert a parity bit associated with the first candidate word when the quantity of errors corresponds to the odd value; select the second candidate word when the parity bit, associated with the first candidate word is inverted; and perform forward error correction, on the word, using the second candidate word based on selection of the second candidate word.

BRIEF DESCRIPTION OF THE DRAWINGS

FIG. 6 is a diagram of an example data structure that stores information identifying parity bit attributes and/or error attributes associated with the candidate words;

FIG. 8 is a diagram of an example data structure that stores information identifying error attributes associated with the candidate words;

FIG. 10 is a diagram of an example data structure that stores information identifying non-least reliable position (LRP) error attributes associated with the candidate words.

DETAILED DESCRIPTION

The following detailed description refers to the accompanying drawings. The same reference numbers in different drawings may identify the same or similar elements.

Systems and/or methods, described herein, may allow a forward error correction device (hereinafter referred to as a "FEC device") to perform a soft iterative forward error correction on a group of samples (hereinafter referred to as an "encoded word") within traffic, using a quantity of candidate words. The FEC device may perform an operation that reduces the quantity of candidate words used to process the encoded word without reducing a quantity of errors that can be corrected by the FEC device. Reducing the quantity of candidate words may allow the FEC device to correct a same quantity of errors, as a traditional FEC device, at a reduced level of complexity and/or expense.

In an example implementation, the FEC device may identify least reliable positions (LRPs) associated with an encoded word. The LRPs may correspond to locations samples, within the encoded words, that the FEC device determines are least reliable based on reliability bits associated with the samples. The FEC device may generate a quantity of candidate words based on various combinations of the LRPs (e.g., $2^N$ combinations, where N represents a quantity of the LRPs and where N>1). The FEC device may perform an operation (sometimes referred to as a "winnowing operation") on the candidate words to reduce the quantity of candidate words to a level that corresponds to having one less LRP (e.g., N−1). The winnowing operation may cause the FEC device to reduce the quantity of candidate words by identifying pairs of candidate words and selecting a best candidate word from each of the identified pairs and/or discarding candidate words that are not selected.

The FEC device may perform the winnowing operation by comparing attributes (e.g., parity bits, bits associated with one or more LRPs, quantities of errors, etc.) associated with each candidate word and selecting a best candidate word based on the comparison of the attributes. The FEC device may also, or alternatively, perform the winnowing operation by identifying duplicate candidate words and selecting one of the duplicate candidate words. The select candidate words may correspond to a reduced quantity of candidate words (e.g., $2^{(N-1)}$, $2^{(N-2)}$, etc.). The FEC device may use the reduced quantity of candidate words to identify and/or correct a similar quantity of errors, within the encoded word, as the conventional FEC device using the quantity of candidate words (e.g., $2^N$). Additionally, or alternatively, the FEC device may identify and/or correct a greater quantity of errors, within the encoded word, that the conventional FEC device at a similar cost or processing complexity.

Figure 1:
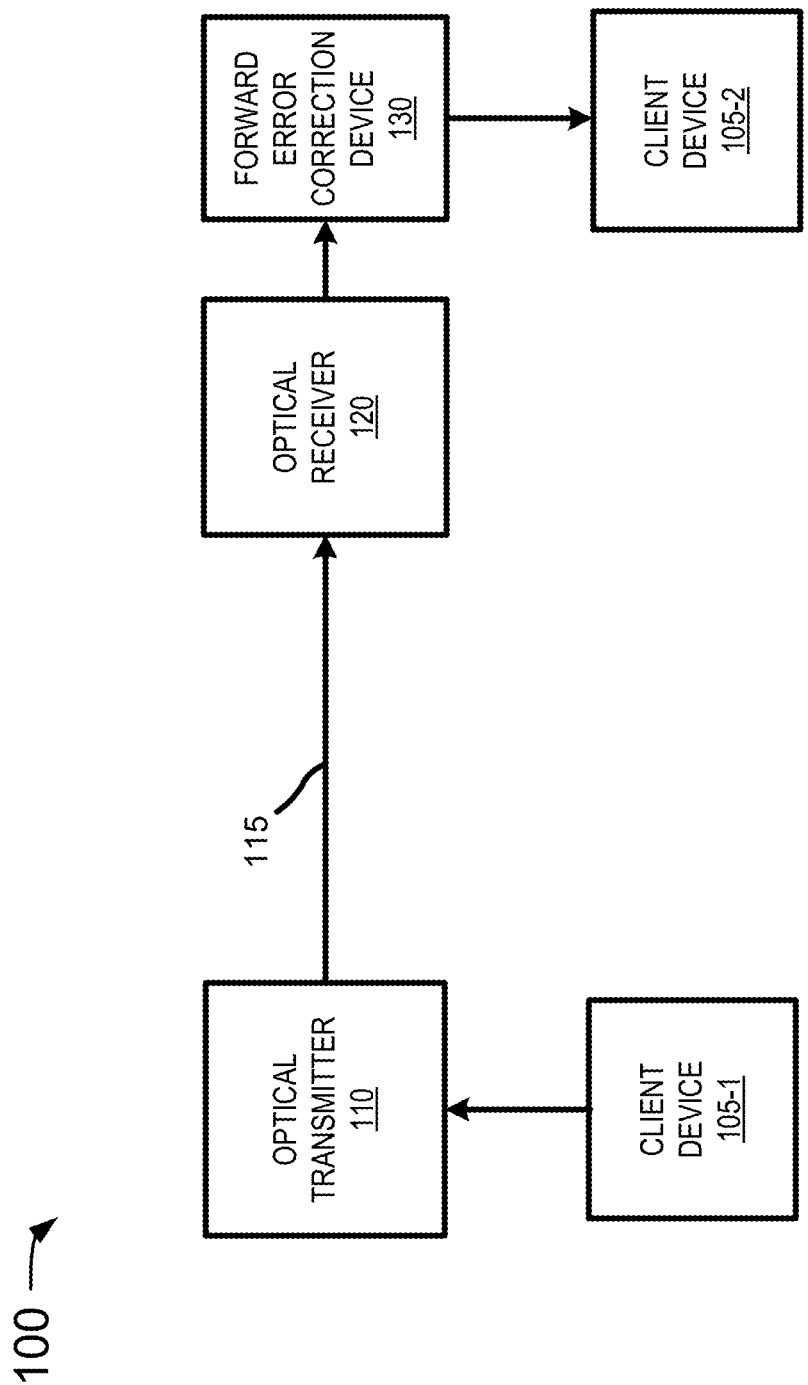
FIG. 1 is a diagram of an example network in which systems and/or methods described herein may be implemented.

FIG. 1 is a diagram of an example network 100 in which systems and/or methods described herein may be implemented. Network 100 may include a pair of client devices 105-1 and 105-2 (hereinafter referred to, in some instances, as "client device 105"), an optical transmitter 110, a link 115, an optical receiver 120, and a forward error correction (FEC) device 130. The number of devices, illustrated in FIG. 1, is provided for explanatory purposes. In practice, there may be additional devices, fewer devices, different devices, or differently arranged devices than illustrated in FIG. 1. Also, in some implementations, one or more of the devices of network 100 may perform one or more functions described as being performed by another one or more of the devices of network 100. For example, functions performed by FEC device 130 could be performed by optical receiver 120 instead of, or in combination with, some other device.

Client device 105 may include a computation and communication device that is capable of communicating with optical transmitter 110, optical receiver 120, and/or FEC device 130. For example, client device 105 may include a radiotelephone, a personal communications system (PCS) terminal (e.g., that may combine a cellular radiotelephone with data processing and data communications capabilities), a personal digital assistant (PDA) (e.g., that can include a radiotelephone, a pager, Internet/intranet access, etc.), a server device, a laptop computer, a tablet computer, a set top box, a digital video recorder (DVR), a personal gaming system, a smart phone, or another type of computation and communication device.

Client device 105-1 may, for example, transmit, to optical transmitter 110, a client signal that includes a stream of packets that carry a payload (e.g., a message, video, audio, a document, etc.), associated with client device 105-1. Optical transmitter 110 may provide the client signal to optical receiver 120. Alternatively, or additionally, client device 105-2 may communicate with FEC device 130 to receive the client signal that has been processed, by optical receiver 120 and/or FEC device 130, to detect and/or correct errors within the client signal. Client device 105-2 may receive the client signal directly from FEC device 130 and/or indirectly from FEC device 130, such as via optical receiver 120.

Optical transmitter 110 may include one or more devices that generate and/or transmit an optical signal to optical receiver 120. Optical transmitter 110 may, in an example implementation, include one or more lasers that generate one or more optical signals. Alternatively, or additionally, optical transmitter 110 may include a modulator that modulates the one or more optical signals based on one or more input electrical signals, such as client signals received from client devices 105. In this example, optical transmitter 110 may modulate the optical signals using one or more modulation techniques (e.g., phase modulation, frequency modulation, amplitude modulation, polarization modulation, and/or other modulation techniques).

Alternatively, or additionally, optical transmitter 110 may include an encoding device that encodes payload bits that are included within a client signal received from client device 105-1. Optical transmitter 110 may encode the payload bits using a forward error correction code (e.g., a Bose, Ray-Chaudhuri (BCH) code, and/or some other type of error correction code). Optical transmitter 110 may also, or alternatively, iteratively encode rows and/or columns of payload bits as a block and/or a frame of a fixed quantity of encoded payload bits to be described in greater detail below with respect to FIG. 3. Each encoded row and/or column may include encoded payload bits (sometimes referred to as "product codes") and error identification and/or correction bits associated with the product codes within the rows.

Alternatively, or additionally, optical transmitter 110 may include a multiplexer to multiplex the modulated optical signals (e.g., using wavelength-division multiplexing (WDM)) into an optical signal, associated with different wavelengths, for transmission to optical receiver 120.

Link 115 may include one or more devices and/or mechanisms to allow an optical signal to be transported to optical receiver 120. Link 115 may, in one example, include one or more optical fibers and/or fiber optic cables that allow the optical signal to be transported from optical transmitter 110 to optical receiver 120.

Optical receiver 120 may include one or more devices that receive, convert, process, amplify, and/or demodulate optical and/or electrical signals in a manner described herein. Optical receiver 120, in one implementation, may include one or more polarization beam splitting (PBS) devices that split the optical signal into one or more optical signals associated with different polarizations (e.g., a transverse magnetic (TM) polarization, a transverse electric (TE) polarization, etc.). Alternatively, or additionally, optical receiver 120 may include a demultiplexer device that demultiplexes a multi-wavelength optical signal (e.g., using wavelength-division demultiplexing techniques), received from optical transmitter 110, into multiple optical signals associated with different wavelengths. Alternatively, or additionally, optical receiver 120 may include one or more demodulators that convert the optical signals into electrical signals on which optical receiver 120 can perform signal processing. Alternatively, or additionally, optical receiver 120 may include an analog-to-digital converter to convert analog signals to digital signals, while preserving enough analog information to allow the reliability of the signal to be estimated.

Optical receiver 120, in one example, may include a signal processing device that processes an electrical signal by inserting reliability bits into a stream of encoded samples (e.g., that includes encoded payload bits and/or bits associated with error identification and/or correction), included within the electrical signal. Optical receiver 120 may generate one or more reliability bits, associated with each sample, based on a determination of a respective level of reliability of each encoded payload bit within each sample.

Optical receiver 120 may, for example, determine an amplitude (e.g., based on a power level, a voltage level, etc.), of an encoded payload bit within a sample. Optical receiver 120 may also, or alternatively, determine that the amplitude is greater than a first threshold (e.g., +1 volt, +3 volts, etc.). When the amplitude is greater than the first threshold, optical receiver 120 may insert, into the sample, reliability bits associated with a first level of reliability (e.g., a first reliability value of +3 or some other first reliability value) for a bit likely to be a logical mark associated with a first value (e.g., a value of 1 or some other first value). The reliability bits may, for example, be encoded in two's complement notation as (0, 1, 1, where the left-most bit (0) represents the positive sign of the reliability value and the other bits (1, 1) represent the reliability value of 3).

Alternatively, or additionally, optical receiver 120 may determine that the amplitude is less than a second threshold (e.g., −1 volt, −3 volts, etc.). When the amplitude is less than the second threshold, optical receiver 120 may insert, into the sample, reliability bits that correspond to the first level of reliability (e.g., represented by a second reliability value of −3 or some other second reliability value) for a bit likely to have been transmitted as a logical space associated with a second value (e.g., a value of 0 or some other second value). The reliability bits may, in this example, be encoded in two's complement notation as (1, 0, 1, where left-most bit (1) represents the negative sign of the reliability value and the other bits (0, 1) represent the reliability value).

Alternatively, or additionally, optical receiver 120 may determine that the amplitude, is less than a third threshold (e.g., 0.25 volts, or some other value) and is greater than a fourth threshold (e.g., −0.25 volts, or some other value). When the amplitude is less than the third threshold and greater than the fourth threshold, optical receiver 120 may insert, into the sample, reliability bits that correspond to a second level of reliability (e.g., a third reliability value of 0 or some other third reliability value). The reliability bits may, in this example, be encoded in two's complement notation as (0, 0, 0).

Optical receiver 120 may insert, into the sample, other reliability bits associated with one or more third levels of reliability that are less than the first level of reliability and greater than the second level of reliability (e.g., +2, +1, etc.), for positive amplitudes that are less than the first threshold and greater than the third threshold. Additionally, or alternatively, optical receiver 120 may insert, into the sample, other reliability bits associated with one or more third levels of reliability (e.g., −2, −1, etc.), for negative amplitudes that are greater than the second threshold and less than the fourth threshold. Optical receiver 120 may output, to FEC device 130, an electrical signal that includes a stream of samples that identify levels of reliability (e.g., based on the reliability bits) of payload bits included within the samples.

FEC device 130 may include one or more devices that receive, process, and/or perform other operations on the electrical signals, received from optical receiver 120, in a manner described herein. FEC device 130 may receive electrical signals from optical receiver 120 and may perform a FEC operation on the electrical signal to identify and/or correct errors within the electrical signal and/or to remedy a condition, associated with the electrical signal, caused by the identified errors.

Figure 2:
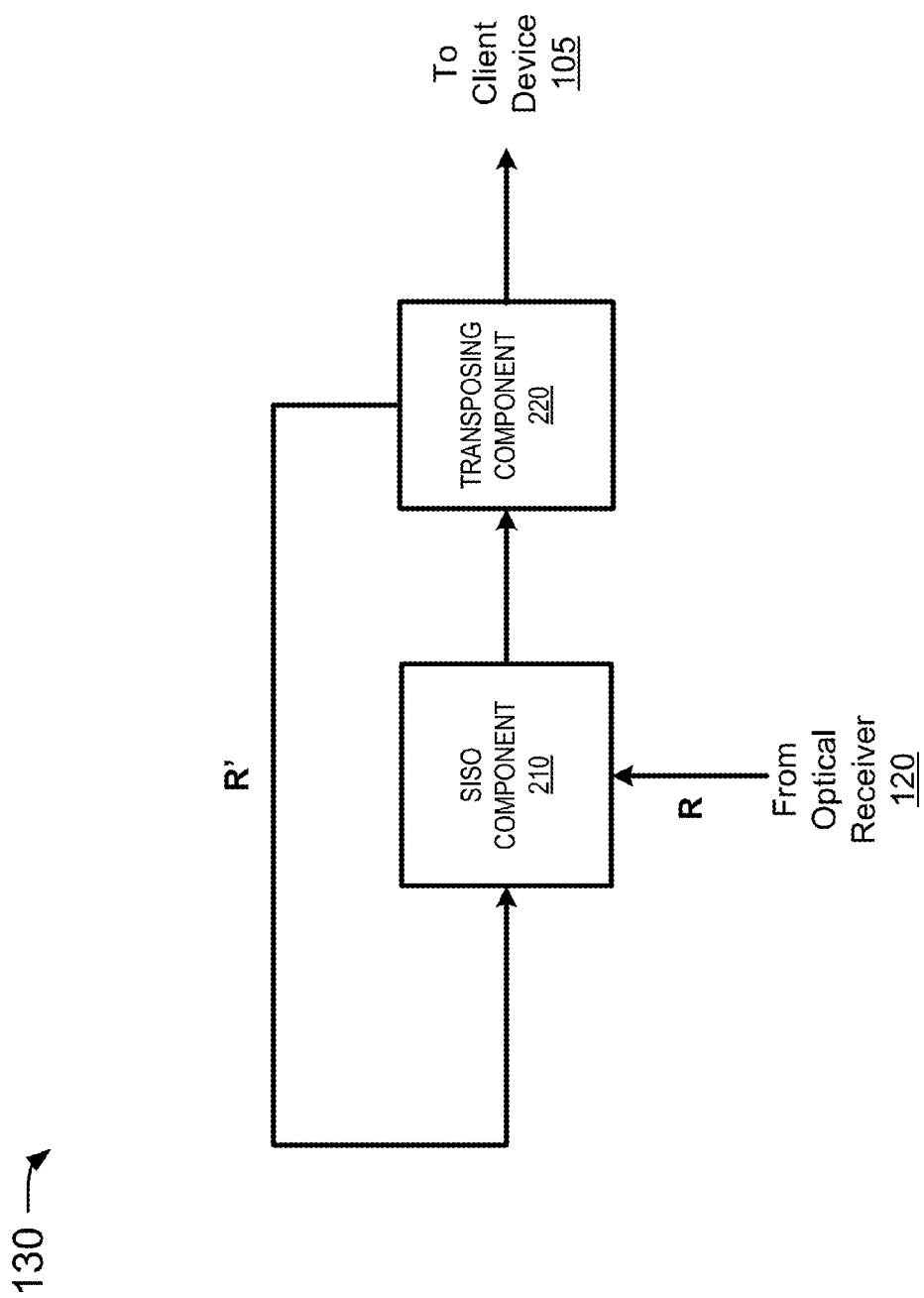
FIG. 2 is a diagram of example components of a forward error correction device of FIG. 1.

FIG. 2 is a diagram of example components of FEC device 130. As illustrated in FIG. 2, FEC device 130 may include a collection of components, such as a soft-input-soft-output (SISO) component 210 and a transposing component 220. Although FIG. 2 shows example components of FEC device 130, in other implementations, FEC device 130 may contain fewer components, additional components, different components, or differently arranged components than depicted in FIG. 2. Alternatively, or additionally, one or more of the components of FEC device 130 may perform one or more functions described as being performed by another one or more of the components of FEC device 130.

SISO component 210 may include one or more components that receive, process, and/or perform operations on an electrical signal, received from optical receiver 120, in a manner described herein. SISO component 210 may, for example, receive a block (or a frame) of a fixed quantity of samples from optical receiver 120 (e.g., shown as R) and may perform a soft, iterative forward error correction operation on the block of samples. In one example, SISO component 210 may perform the operation on one or more encoded words based on one or more rows and/or columns of samples obtained from the block of samples. Additionally, or alternatively, SISO component 210 may output, to transposing component 220, the encoded words on which the operation was performed. Transposing component 220 may transpose the rows and columns of the encoded words and may output, to SISO component 210, a processed block of samples (e.g., shown as R') based on transposing the rows and columns of the encoded words.

For example, SISO component 210 may sort samples, included within an encoded word, based on respective reliability values associated with each of the samples. SISO component 210 may also, or alternatively, select one or more of the samples associated with a lowest reliability value (sometimes referred to herein as "least reliable positions (LRPs)"). Additionally, or alternatively, SISO component 210 may generate candidate words based on the LRPs (e.g., $M=2^N$, where M>2 represents a quantity of candidate words, and N>1 represents a quantity of LRPs). Each candidate word may differ from the encoded word based on the one or more samples that correspond to the one or more LRPs. In an example, a first candidate word may differ from the encoded word based on a sample, associated with an LRP, being inverted relative to a corresponding sample, within the encoded word. Additionally, or alternatively, an inverted sample, within the first candidate word, may correspond to a different amplitude (e.g., an amplitude, such as +1) than a corresponding sample (e.g., with an amplitude, such as −1) within the encoded word. FEC device 130 may used the LRPs to identify and/or invert other bits within a candidate word.

Additionally, or alternatively, SISO component 210 may determine attributes associated with each candidate words. For example, SISO component 210 may, for a particular candidate word, determine a quantity of samples that have been inverted within the particular candidate word and/or a distance (e.g., a Hamming distance, or some other Euclidean distance) between the particular candidate word and the encoded word. Additionally, or alternatively, SISO component 210 may determine whether to invert a parity bit, associated with the particular candidate word, based on whether a quantity of errors, associated with the particular candidate word, is odd or even. Additionally, or alternatively, SISO component 210 may determine a quantity of errors associated with the candidate words, etc.

SISO component 210 may identify pairs of candidate words (e.g., candidate words 1 and 2, candidate words 3 and 4, candidate words 5 and 6, etc.). SISO component 210 may also, or alternatively, compare attributes of a candidate word with attributes of another candidate word within a pair of candidate words. SISO component 210 may also, or alternatively, select a best candidate word based on the comparison. SISO component 210 may also, or alternatively, determine whether a candidate word is a duplicate of one or more other candidate words. When duplicate candidate words are identified, SISO component 210 may select one of the duplicate candidate words. SISO component may use the selected candidate words to process the encoded word.

SISO component 210 may also, or alternatively, perform another iteration using the processed block of samples (e.g., corresponding to R') and the original block of samples (e.g., corresponding to R) to generate another processed block of samples (e.g., R') that includes fewer errors than the processed block of samples. SISO component 210 may perform the iterations by alternating between rows and columns and/or based on some other pattern of processing. SISO component 210 may, for each iteration, dynamically adjust a reliability value, associated with each sample, to cause the quantity of errors to decrease, with each successive iteration, until the operation converges (e.g., when all the errors are corrected).

Transposing component 220 may include one or more components that allow samples associated with the block of samples to be stored, retrieved, and/or transposed. In an example implementation, transposing component 220 may include a memory that stores the block of samples within rows and/or columns associated with a forward error correction frame. Transposing component 220 may write samples to the rows and/or columns and/or may read samples from the rows and/or columns. Transposing component 210 may also, or alternatively, cause a sample, that is stored at a first location within the memory that corresponds to a position within a row, to be read from the first location and written to a second location, within the memory, that corresponds to a position within a column. Additionally, or alternatively, transposing component 210 may also, or alternatively, cause another sample, that is stored at a third location within the memory that corresponds to another position within a column, to be read from the third location and written to a fourth location, within the memory, that corresponds to another position within a row.

Figure 3:
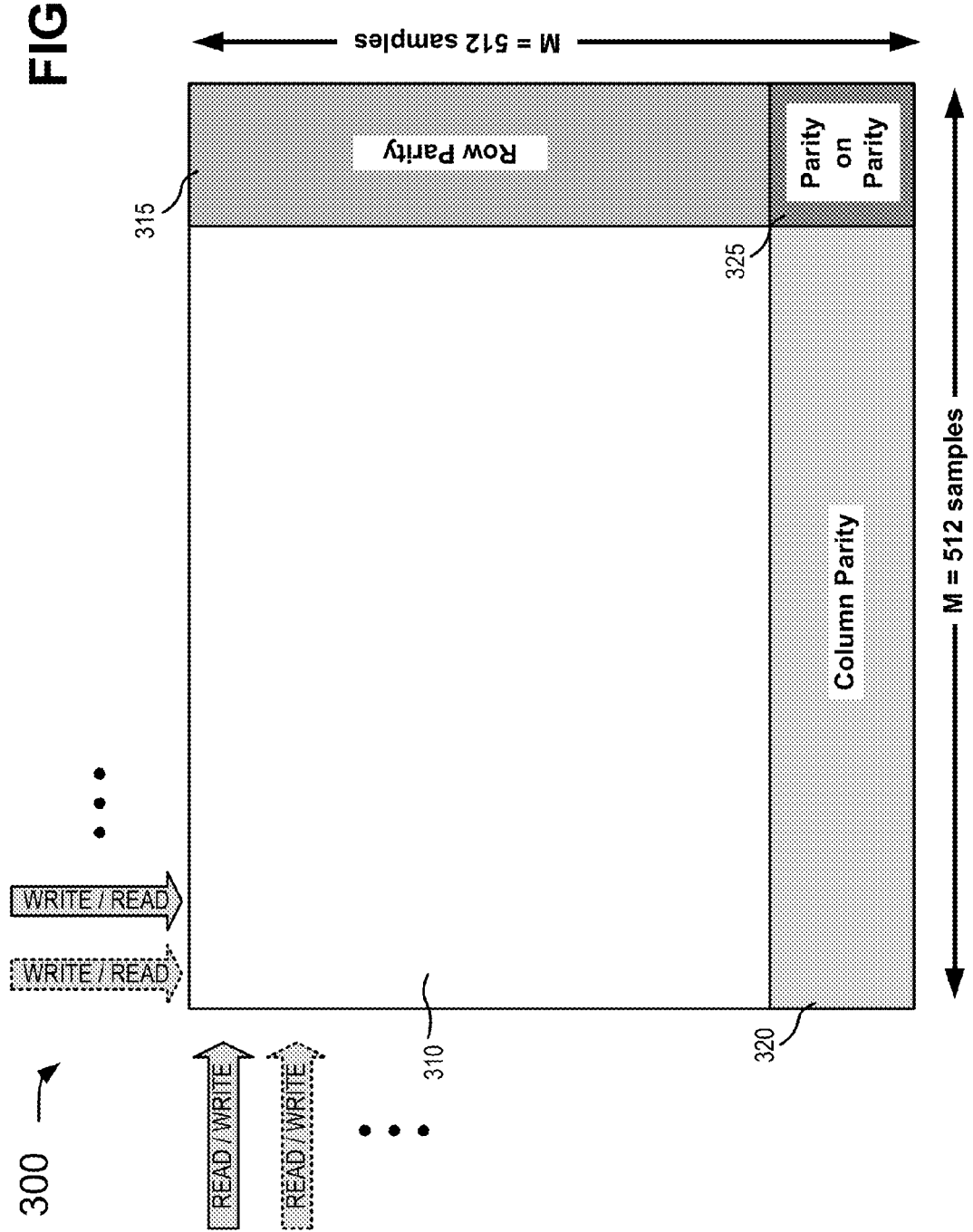
FIG. 3 is a diagram of an example data structure that stores encoded words according to an implementation described herein.

FIG. 3 is a diagram of an example data structure 300 that stores encoded words according to an implementation described herein. In one example, data structure 300 may be stored in a memory associated with FEC device 130. Additionally, or alternatively, data structure 300 may be stored in a memory associated with optical receiver 120. As shown in FIG. 3, data structure 300 may include an encoded word field 310, a row parity field 315, a column parity field 320, and/or a parity on parity field 325. The quantity of fields, within data structure 300, are included for explanatory purposes. Additionally, or alternatively, there may be additional fields, fewer fields, different fields, or differently arranged fields than are shown with respect to data structure 300.

Encoded word field 310 may store encoded words in horizontal rows and/or vertical columns. The encoded words may be generated, by optical transmitter 110, based on a signal received from client device 105 and iterative forward error correction encoding by optical transmitter 110 (e.g., using a forward error correction code). Optical transmitter 110 may transmit an optical signal, that includes the encoded words, to optical receiver 120. Optical receiver 120 may receive the optical signal and may store the encoded words in encoded word field 310. Each encoded word may include a group of samples.

Each sample may include one or more payload bits associated with a client signal, one or more bits used for error identification and/or correction, and/or one or more reliability bits that identify a level of reliability associated with the payload bits. A quantity of samples, associated with the encoded words, may be predetermined based on capacities of horizontal rows and/or vertical columns of data structure 300. Optical receiver 120 may associate the reliability bits with the samples in a manner similar to that described above with respect to FIG. 1. Optical receiver 120 may transmit the samples to FEC device.

By way of example, FEC device 130 may horizontally write samples to a row as an encoded word. A different encoded word may be horizontally written to each row (e.g., as shown by the right-pointing arrows labeled as "read/write") until data structure 300 has reached capacity. Alternatively, or additionally, FEC device 130, may vertically write samples to a column as an encoded word. A different encoded word may be written to each column (e.g., as shown by the down-pointing arrows labeled as "read/write") until data structure 300 has reached capacity. Encoded words may also, or alternatively, be read from the rows and processed by FEC device 130, and the processed encoded words may be written to the rows. Additionally, or alternatively, encoded words may be read from the columns and processed by FEC device 130, and the processed encoded words may be written to the columns.

Row parity field 315, may store error correction bits that can be used, by FEC device 130, to decode encoded words, stored within the horizontal rows, on an iterative basis. Column parity field 320 may store other error correction bits that can be used, by FEC device 130, to decode encoded words, stored within the vertical columns, on an iterative basis. For example, the error correction bits, stored within row parity field 315 and/or column parity field 320, may be generated by optical transmitter 110 and inserted into an optical signal for transmission to optical receiver 120. Optical receiver 120 may receive the optical signal and may cause the error correction bits to be stored in row parity field 315 and/or column parity field 320. FEC device 130 may use the error correction bits to identify and/or correct errors within encoded words stored within the horizontal rows and/or vertical columns.

Parity on parity field 325 may store error correction bits that allow the error correction bits within row parity field 315 and/or column parity field 320 to be decoded and/or checked for errors. For example, the error correction bits, stored within parity on parity field 325, may be generated by optical transmitter 110 and inserted into the optical signal for transmission to optical receiver 120. Optical receiver 120 may receive the optical signal and may cause the error correction bits to be stored in parity on parity field 325. FEC device 130 may use the error correction bits to identify and/or correct errors within row parity field 315 and/or column parity field 320.

In an example implementation, data structure 300 may be sized to conform to a block of samples and/or a forward error correction frame of samples. In one example, data structure 300 may include 512 rows and 512 columns (e.g., 512×512) and may store encoded words in 493 rows (e.g., rows 0 through 492) and error correction bits, associated with column parity field 320, in the remaining rows (e.g., rows 493 through 511). Additionally, or alternatively, data structure 300 may store encoded words 313 within 493 columns (e.g., columns 0 through 492) and error correction bits, associated with row parity field 315, in the remaining columns (e.g., columns 493 through 511).

While the description below describes a soft iterative forward error correction operation in the context of a 512×512 data structure, such as data structure 300, for explanatory purposes, in other implementations, for example, the soft iterative forward error correction operation could be performed using a data structure with a quantity of rows and/or columns that are different from 512×512.

Figure 4:
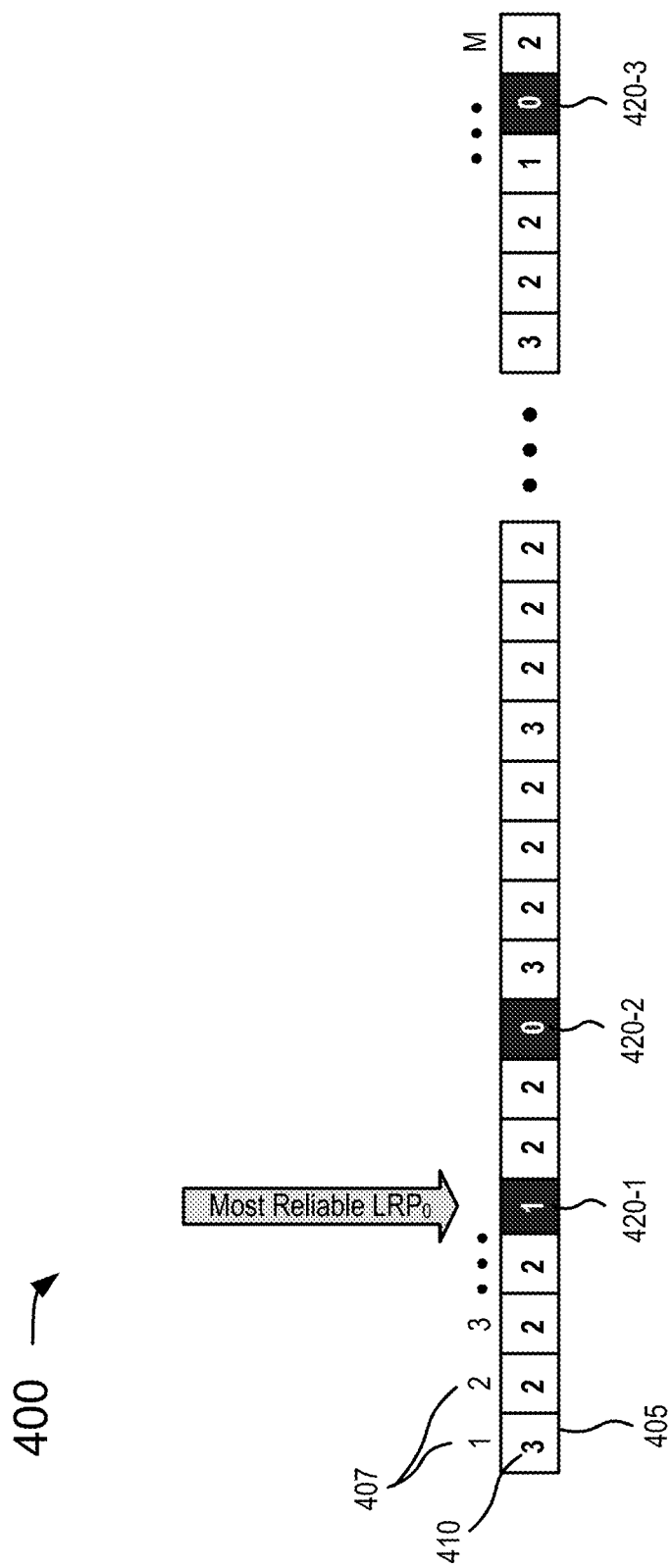
FIG. 4 is a diagram of an example encoded word that may be stored in the example data structure of FIG. 3.

FIG. 4 is a diagram of an example encoded word 400 stored in data structure 300 of FIG. 3. Encoded word 400 may include a collection of samples 405 (hereinafter referred to collectively as "samples 405" and individually as "sample 405"), a set of bit positions 407 (hereinafter referred to collectively as "positions 407" and individually as "position 407"), a set of reliability values 410 (hereinafter referred to collectively as "reliability values 410" and individually as "reliability value 410"), and a collection of least reliable positions (LRPs) 420-1, . . . , 420-3 (hereinafter referred to collectively as "LRPs 420"). The quantity of positions, values, and/or samples within encoded word 400 is included for explanatory purposes. In another implementation, there may be additional positions, values, and/or samples; fewer positions, values, and/or samples; different positions, values, and/or samples; and/or differently arranged positions, values, and/or samples than are shown in FIG. 4.

Sample 405 may include a collection bits, such as one or more encoded payload bits, one or more error identification and/or correction bits, and/or one or more reliability bits. Each encoded word may include a collection of samples 405 in a manner similar to that described above with respect to FIG. 3. Position 407 may identify a position, within encoded word 400, relative to a particular sample 405 associated with encoded word 400. For example, a first sample 405 (e.g., a left most sample 405) may correspond to a first position 407 (e.g., shown as 1); a second sample 405, within encoded word 400, may correspond to a second position 407 (e.g., shown as 2); a last sample 405 (e.g., a right most sample 405) may correspond to a last position 407 (e.g., shown as M, where M>1); etc.

Reliability value 410 may identify a level of reliability associated with a particular sample 405 and/or an encoded payload bit associated with the particular sample 405. For example, reliability value 410 may, in a manner similar to that described above with respect to FIG. 1, correspond to a level of reliability identified by one or more reliability bits associated with the particular sample 405. For example, a first reliability value 410 (e.g., 3) may correspond to a highest level of reliability of a payload bit. A second reliability value 410 (e.g., 0) may correspond to a lowest level of reliability of a payload bit. A third reliability value 410 (e.g., 1 or 2) may correspond to one or more levels of reliability, of a payload bit, that is higher than the lowest level of reliability and lower than the highest level of reliability. Reliability values 410 are described herein as including only positive values (e.g., between 0 and +3) for simplicity. In one example, reliability values 410 may be represented as an absolute value of reliability values 410 that include positive and/or negative values (e.g., +3 and/or −3, +2 and/or −2, +1 and/or −1, 0, etc.). In another example, reliability values 410 may not be represented as an absolute value and may include positive and/or negative values.

LRP 420 may correspond to a particular sample 405 associated with a reliability value 410 that is determined, by FEC device 130, to be among lowest reliability values 410 within encoded word 400. For example, FEC device 130 may sort samples 405 based on reliability values 410, associated with samples 405, to identify a sorted set of reliability values 410 (e.g., $\{0, 0, 1, \ldots, 2, 2, 2, \ldots, 3, 3, 3, \ldots\}$). FEC device 130 may also, or alternatively, identify samples 405 associated with the lowest reliability values 410 based on the sorted set of reliability values 410. Additionally, or alternatively, FEC device 130 may identify, as LRPs 420 (e.g., shown as shaded blocks labeled 420-1 through 420-3), samples 405 with the lowest reliability values 410 (e.g., $\{0, 0, 1\}$). A first LRP 420 (e.g., LRP 420-1) may correspond to a most reliable LRP 420 (e.g., shown by the downward pointing arrow, labeled as "LRP$_0$," in FIG. 4) when reliability value 410, associated with the LRP 420-1, is greater than reliability values 410 associated with the other LRPs 420 (e.g., LRPs 420-2 and 420-03). FEC device 130 may select the identified LRPs 420 and may use the selected LRPs 420 to process encoded word 400. The quantity of selected LRPs 420 (e.g., N) may be predetermined by FEC device 130 and/or an operator of FEC device 130.

In the description below, a soft iterative forward error correction operation is described as being performed using three LRPs 420 (e.g., where N=3) for simplicity. In another example, a soft iterative forward error correction operation could be described as using a quantity of LRPs 420 that is different than three LRPs 420 (e.g., when N=1, 2, 4, 5, 6, etc.).

Figure 5:
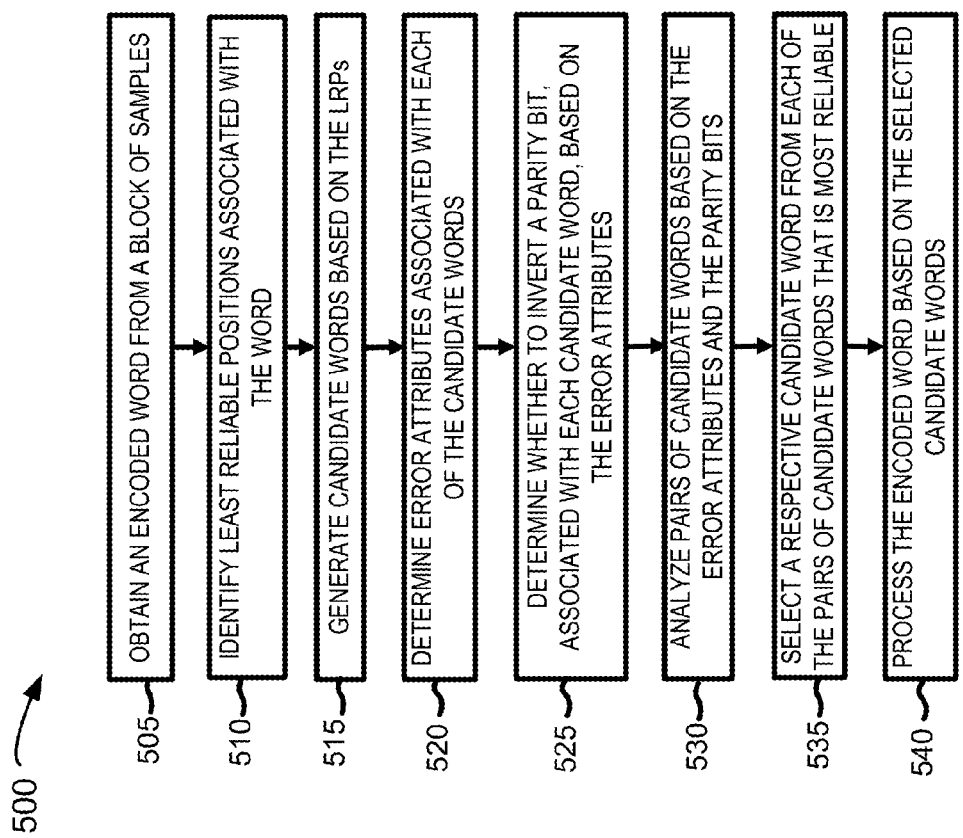
FIG. 5 is a flow chart an example process for reducing a quantity of candidate words based on parity bit attributes and/or error attributes associated with the candidate words.

FIG. 5 is a flow chart of an example process 500 for reducing a quantity of candidate words based on parity bit attributes and/or error attributes associated with the candidate words. In an example implementation, process 500 may be performed by FEC device 130. Additionally, or alternatively, some or all of process 500 may be performed by a device, or combination of devices, separate from, or in combination with, FEC device 130. FIG. 6 is a diagram of an example data structure 600 that stores information identifying parity bit attributes and/or error attributes associated with the candidate words. In the description below, some or all of process 500 will be described with references to data structure 600 of FIG. 6.

As shown in FIG. 5, process 500 may include obtaining an encoded word from a block of samples (block 505) and identifying least reliable positions associated with the word (block 510). For example, FEC device 130 may receive, from optical receiver 120, a block of samples 405. FEC device 130 may obtain, from the block of samples 405, a row of samples 405 that represents an encoded word. In another example, FEC device 130 may obtain an encoded word from a column of samples 405 within the block of samples 405.

Alternatively, or additionally, FEC device 130 may, in a manner similar to that described above with respect to FIG. 4, analyze reliability values 410 associated with samples 405 included within the encoded word. FEC device 130 may also, or alternatively, identify which samples 405 are associated with lowest reliability values 410. In one example, FEC device 130 may sort samples 405, based on reliability values 410 (e.g., from lowest to highest, highest to lowest, etc.), to identify lowest reliability values 410. FEC device 130 may select, as one or more LRPs 420, a predetermined quantity of samples 405 (e.g., represented by N) associated with lowest reliability values 410. Each of the selected LRPs 420 may correspond to a respective position within the encoded word.

As also shown in FIG. 5, process 500 may include generating candidate words based on the LRPs (block 515) and determining error attributes associated with each of the candidate words (block 520). For example, FEC device 130 may use the LRPs 420 to generate one or more candidate words associated with the encoded word. FEC device 130 may, for example, generate a candidate word based on payload bits associated with the encoded word. Additionally, or alternatively, FEC device 130 may generate the candidate word by inverting a payload bit that corresponds to a first one of LRPs 420. FEC device 130 may, for example, invert the payload bit by causing the payload bit to be changed from a first value to a second value (e.g., from −3 to +3, −2 to +2, −1 to +1, +1 to −1, +2 to −2, +3 to −3, etc.). FEC device 130 may also, or alternatively, generate another candidate word based on the payload bits associated with the encoded word and/or by inverting another payload bit that corresponds to a second one of LRPs 420. FEC device 130 may, thus, generate a different candidate word by inverting a respective payload bit that corresponds to each LRP 420. Additionally, or alternatively, FEC device 130 may generate a candidate word based on inverting two or more payload bits that correspond to two or more LRPs 420. FEC device 130, may, thus, generate candidate words based on all or some of the possible combinations of inverted payload bits that correspond to LRPs 420 (e.g., $2^N$ combinations, where N represents the quantity of LRPs 420).

Additionally, or alternatively, FEC device 130 may analyze and/or process the candidate words and may determine attributes associated with the candidate words. For example, FEC device 130 may determine a first attribute, associated with a candidate word, that identifies a quantity of inverted bits, that correspond to the quantity of LRPs 420 (hereinafter referred to, in some instances, as a "LRP error"). In another example, FEC device 130 may determine a second attribute, associated with the candidate word, that identifies a quantity of errors, within the candidate word, that are not associated with the inverted bits (hereinafter referred to, in some instances, as a "non-LRP error"). Each non-LRP error may be detected, by FEC device 130, using known soft iterative forward error correction techniques. FEC device 130 may determine first attributes for each of the candidate words by determining the quantities of LRP errors associated with each of the candidate words. FEC device 130 may determine second attributes, for each of the candidate words by determining the quantity of non-LRP errors associated with each candidate word.

As further shown in FIG. 5, process 500 may include determining whether to invert a parity bit, associated with each candidate word, based on the error attributes (block 525). For example, FEC device 130 may, based on a combination of the first attributes and the second attributes of a candidate word, determine whether a parity bit, associated with the candidate word, is to be inverted from a third value to a fourth value (e.g., from 0, or some other third value, to 1 or some other fourth value). For example, when a total quantity of errors, associated with the candidate word (e.g., based on a sum of the quantity of LRP errors and the quantity of non-LRP errors), is odd, FEC device 130 may invert the parity bit associated with the candidate word. FEC device 130 may store, in a data structure, the error attributes and an indication that the parity bit is to be inverted.

For example, as shown in FIG. 6, data structure 600 may include a collection of fields, such as a candidate word identifier (ID) field 605, a first LRP field 610, a second LRP field 615, a third LRP field 620, a LRP error field 625, a non-LRP error field 630, and a parity invert field 635. The quantity of fields within data structure 500 is included for explanatory purpose. In another implementation, there may be additional fields, fewer fields, different fields, or differently arranged fields than are shown in FIG. 6.

Candidate word ID field 605 may store information that identifies a particular candidate word (e.g., a unique identifier, etc.). First LRP field 610 may store information that identifies whether a first payload bit, within the particular candidate word and that corresponds to a first LRP 420, has been inverted. For example, first LRP field 610 may store a first value (e.g., 1) when the first payload bit has been inverted and may store a second value (e.g., 0) when the first payload bit has not been inverted. In one example, first LRP field 610 may correspond to most reliable LRP 420 (e.g., based on a highest reliability value 410 among reliability values 410 associated with LRPs 420).

Second LRP field 615 may store information that identifies whether a second payload bit, within the particular candidate word, has been inverted. In one example, second LRP field 610 may correspond to a reliability level, of the second payload bit, that is less than the reliability level associated with the first payload bit identified by first LRP field 610. Third LRP field 620 may store information that identifies whether a third payload bit, within the particular candidate word, has been inverted. In one example, third LRP field 610 may correspond to a reliability level, of the third payload bit, that is less than the reliability level associated with the second payload bit identified by second LRP field 610.

LRP error field 625 may store information that identifies a quantity of LRP errors associated with the particular candidate word. The quantity of LRP errors may, for example, be identified based on a quantity of inverted bits, corresponding to LRPs 420, within the particular candidate word. In one example, FEC device 130 may determine a sum of LRP errors based on inverted bits identified by first LRP field 610, second LRP field 615, and/or third LRP field 620.

Non-LRP error field 630 may store information that identifies a quantity of non-LRP errors associated with the particular candidate word. The quantity of non-LRP errors may, for example, be identified, by FEC device 130, when a decoding operation is performed on the particular candidate word.

Parity invert field 635 may store an indication of whether a parity bit, associated with the particular candidate word, is to be inverted. For example, FEC device 130 may invert the parity bit from a first value (e.g., 0) to a second value (e.g., 1) when a quantity of errors (e.g., LRP errors and non-LRP errors), identified in fields 610-630, corresponds to an odd quantity of errors. Additionally, or alternatively, FEC device 130 may invert the parity bit from the second value (e.g., 1) to the first value (e.g., 0) when the quantity of errors, identified in fields 610-630, corresponds to an even quantity of errors.

By way of example, FEC device 130 may, for a first candidate word and a second candidate word, store an identifier associated with the first candidate word (e.g., 00) and/or an indication that a first payload bit, associated with a first LRP 420, is not inverted (e.g., 0) (e.g., as shown by ellipse 642 of FIG. 6). FEC device 130 may also, or alternatively, store an indication that a second payload bit, associated with a second LRP 420, is not inverted (e.g., 0) and/or an indication that a third payload bit, associated with a third LRP 420, is not inverted (e.g., 0) (e.g., as shown by ellipse 642). Additionally, or alternatively, FEC device 130 may store a value that corresponds to quantity of LRP errors (e.g., 0) based on a quantity of inverted payload bits and/or another value that corresponds to a quantity of non-LRP errors identified as a result of decoding the first candidate word (e.g., 2) (e.g., as shown by ellipse 642). FEC device 130 may also, or alternatively, store an indication that a parity bit, associated with the first candidate word, has not been inverted (e.g., 0) when a total quantity of errors (e.g., $Q_E$), within the first candidate word, corresponds to an even value (e.g., 2) (e.g., as shown by ellipse 642). The total quantity of errors may, for example, be based on a combination of a quantity of non-LRP errors (e.g., $Q_{NLRP}$) and a quantity of the LRP errors (e.g., where $Q_E = Q_{LRP} + Q_{NLRP}$, where $Q_{LRP}$ represents the quantity of the LRP errors).

Additionally, or alternatively, FEC device 130 may, for a second candidate word, store an identifier associated with the second candidate word (e.g., 01) and/or an indication that a first payload bit, associated with first LRP 420, has been inverted (e.g., 1) (e.g., as shown by ellipse 644 of FIG. 6). FEC device 130 may also, or alternatively, store an indication that a second payload bit, associated with the second LRP 420, has not been inverted (e.g., 0) and/or an indication that a third payload bit, associated with the third LRP 420, has not been inverted (e.g., 0) (e.g., as shown by ellipse 644). Additionally, or alternatively, FEC device 130 may store a value that corresponds to a quantity of LRP errors (e.g., 1) and/or another value that corresponds to a quantity of non-LRP errors (e.g., 2) (e.g., as shown by ellipse 644). FEC device 130 may also, or alternatively, store an indication that a parity bit, associated with the second candidate word, has been inverted (e.g., 1) when a total quantity of errors (e.g., $Q_E$), within the second candidate word, corresponds to an odd value (e.g., 3) (e.g., as shown by ellipse 644).

FEC device 130 may also, or alternatively, determine that a quantity of non-LRP errors, associated with a fourth candidate word (e.g., associated with candidate word ID 03 as shown in ellipse 648 of FIG. 6) is greater than an error threshold and may determine that the fourth candidate word is not correctable. The error threshold may, for example, represent a maximum quantity of non-LRP errors that can be processed by FEC device 130. The threshold may also, or alternatively, be related to a maximum distance (e.g., a Hamming distance, a Euclidean distance, etc.), between bits of a candidate word and bits of the encoded word, that can be processed by FEC device 130. Thus, when the quantity of non-LRP errors (e.g., shown as >2 by ellipse 648) is greater than the error threshold, FEC device 130 may ignore the candidate word, may discard the candidate word, and/or may not store an indication whether the parity bit is to be inverted.

Additionally, or alternatively, for a third candidate word (e.g., associated with candidate word ID 02), FEC device 130 may store an indication that the parity bit is to be inverted when the total errors is odd (e.g., when the quantity of non-LRP errors corresponds to 1) or may store an indication that the parity bit is not to be inverted (e.g., when the quantity of non-LRP errors corresponds to 0 or 2) (e.g., shown as 1 or 0 by ellipse 646). Additionally, or alternatively, FEC device 130 may, in a manner similar to that described above, store identifiers and/or indications, associated with other candidate words (e.g., as shown by ellipses 650 and 656 of FIG. 6).

Returning to FIG. 5, process 500 may include analyzing pairs of candidate words based on the error attributes and the parity bits (block 530) and selecting a respective candidate word, from each of the pairs of candidate words, that are most reliable (block 535). For example, FEC device 130 may identify pairs of candidate words and may analyze candidate words within each pair, to determine which of the candidate words is most reliable. In one example, FEC device 130 may compare the first candidate word (e.g., identified as 00 in FIG. 6) to a second candidate word (e.g., identified as 01 in FIG. 6). For example, FEC device 130 may, for the first pair of candidate words, determine reliability value (hereinafter referred to, in some instances, as a "first soft metric") associated with a most reliable LRP 420 (e.g., $LRP_0$, and represented by the first LRP 420 of FIG. 4) that is not inverted. Additionally, or alternatively, FEC device 130 may, for the first pair of candidate words, determine a second soft metric associated with a parity bit that has not been inverted. FEC device 130 may identify a sign (e.g., sometimes referred to as a decision metric (DM)) associated with a combination of the first soft metric (e.g., SM(LRP0)) and the second soft metric (e.g., SM(parity bit)) and may select one of the candidate words based on the decision metric.

For example, based on the comparison of the first and second candidate words, FEC device 130 may determine that the first candidate word does not include an inverted first LRP 420 and may, thus, determine the first soft metric based on an absolute value of a reliability value associated with the first LRP 420 (e.g., 1 or some other positive reliability value). Additionally, or alternatively, FEC device 130 may determine that the first candidate word does not include an inverted parity bit, which may indicate that the second soft metric is to be added to the first soft metric. Based on a determination that the sum of the absolute value of the first soft metric and the second soft metric is positive (e.g., DM=|SM(LRP0)|+SM (parity bit)), FEC device 130 may select the first candidate word and/or may discard the second candidate word.

Additionally, or alternatively, FEC device 130 may analyze a next pair of candidate words that includes the third candidate word (e.g., identified as 02 in FIG. 6) and the fourth candidate word (e.g., identified as 03 in FIG. 6). For example, FEC device 130 may, as described above, determine that the quantity of non-LRP errors (e.g., >2 as shown by ellipse 648 of FIG. 6), associated with the fourth candidate word, is greater than an error threshold. FEC device 130 may determine that the fourth candidate word is not correctable when the quantity of non-LRP errors is greater than the threshold. FEC device 130 may also, or alternatively, select the third candidate word when the fourth candidate word is not correctable and/or based on the determination that the third candidate word is correctable.

Additionally, or alternatively, FEC device 130 may analyze a next pair of candidate words that includes the fifth candidate word (e.g., identified as 04 in FIG. 6) and the sixth candidate word (e.g., identified as 05 in FIG. 6). For example, FEC device 130 may determine that the fifth candidate word includes an inverted first LRP 420 and may, thus, determine the first soft metric to be equal to zero. Additionally, or alternatively, FEC device 130 may determine that the fifth candidate word includes an inverted parity bit, which may indicate that the second soft metric is to be subtracted from the first soft metric. Based on a determination that the sum of the absolute value of the first soft metric and the second soft metric is negative (e.g., DM=|SM(LRP0)|−SM(parity bit)), FEC device 130 may select the sixth candidate word and/or may discard the fifth candidate word. Additionally, or alternatively, FEC device 130 may identify other pairs of the candidate words and may select one candidate word from each pair of candidate words in a manner similar to that described above.

As further shown in FIG. 5, process 500 may include processing the encoded word based on the selected candidate words (block 540). For example, FEC device 130 may, using known soft forward error correction techniques, use the selected candidate words to identify a version of the encoded word that includes fewer errors than are included within the encoded word. FEC device 130 may also, or alternatively, process other encoded words, obtained from the block of samples, in a manner similar to that described above. FEC device 130 may also, or alternatively, continue to process the other encoded words until all of the encoded words, within the block of samples, have been processed.

Figure 7:
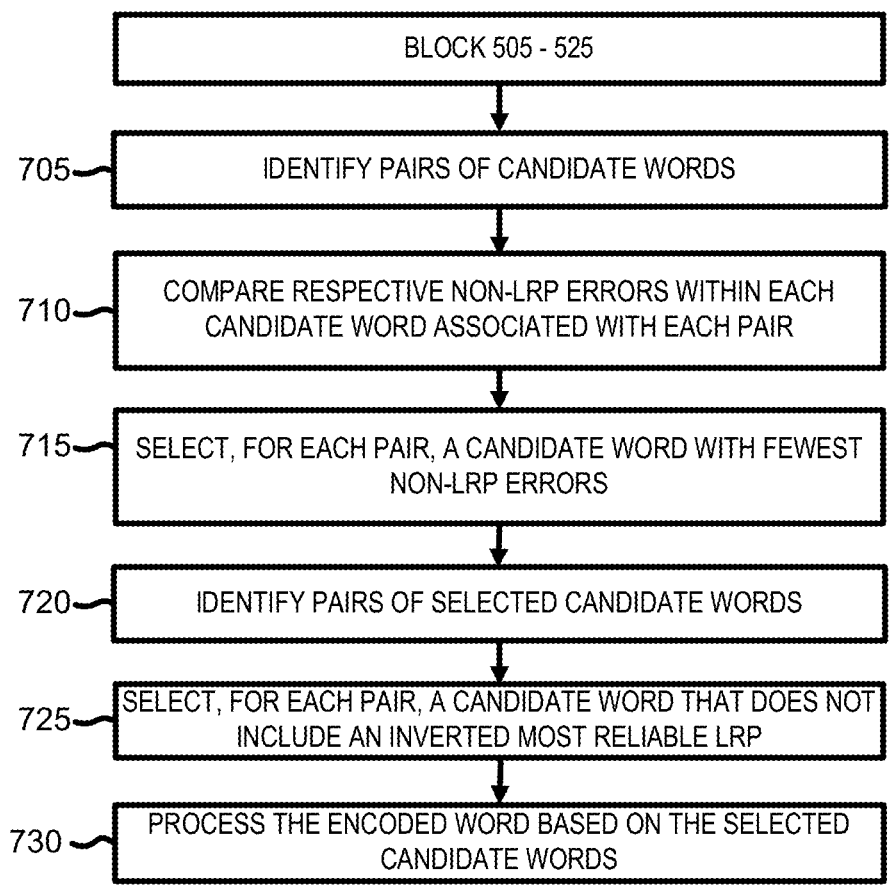
FIG. 7 is a flow chart an example process for reducing a quantity of candidate words based on error attributes associated with the candidate words.

FIG. 7 is a flow chart an example process 700 for reducing a quantity of candidate words based on error attributes associated with the candidate words. In an example implementation, process 700 may be performed by FEC device 130. Additionally, or alternatively, some or all of process 700 may be performed by a device, or combination of devices, separate from, or in combination with, FEC device 130. FIG. 8 is a diagram of an example data structure 800 that stores information identifying error attributes associated with the candidate words. In the description below, some or all of process 700 will be described with references to data structure 800 of FIG. 8.

Assume, in the description below and in a manner similar to that described above with respect to blocks 505 and 510 of FIG. 5, that FEC device 130 has obtained an encoded word from a block of samples and has identified one or more LRPs 420 associated with the encoded word. Assume further that FEC device 130 has, in a manner similar to that described above with respect to block 515 of FIG. 5, generated one or more candidate words based on the identified LRPs 420. Assume still further that FEC device 130 has, in a manner similar to that described above with respect to block 520 of FIG. 5, determined error attributes associated with each of the candidate words. The error attributes may, for example, identify a respective quantity of LRP errors and a respective quantity of non-LRP errors within each of the candidate words.

As shown in FIG. 7, process 700 may include identifying pairs of candidate words (block 705). For example, FEC device 130 may identify pairs of candidate words on which to compare error attributes. FEC device 130 may, for example, identify a first pair of candidate words based on a first candidate word and a second candidate word. FEC device 130 may also, or alternatively, identify a second pair of candidate words that include a third candidate word and a fourth candidate word. FEC device 130 may also, or alternatively, identify other pairs of candidate words in a manner that permits all candidate words to be associated with a pair of candidate words.

As also shown in FIG. 7, process 700 may include comparing respective non-LRP errors within each candidate word associated with each pair of candidate words (block 710) and selecting, for each pair of candidate words, a candidate word with fewest non-LRP errors (block 715). For example, FEC device 130 may identify a first quantity of non-LRP errors within a first candidate word associated with a first pair of candidate words. FEC device 130 may also, or alternatively, identify a second quantity of non-LRP errors within a second candidate word associated with the first pair of candidate words. The first quantity of non-LRP errors and the second quantity of non-LRP errors may be based on first error attributes associated with the first candidate word and second error attributes associated with the second candidate word, respectively. FEC device 130 may also, or alternatively, compare the first quantity to the second quantity.

For example, as shown in FIG. 8, data structure 800 may include a collection of fields, such as fields 605-630 (FIG. 6), a round one selection field 805 (hereinafter referred to as "first selection field 805"), and a round two selection field 810 (hereinafter referred to as "second selection field 810"). The quantity of fields within data structure 800 is provided for explanatory purposes. In another example, data structure may include fewer fields, greater fields, different fields, or differently arranged fields that are shown in FIG. 8.

First selection field 805 may identify one or more candidate words that are selected for further processing and/or one or more other candidate words that are not selected for further processing and/or are to be discarded. Determination of whether or not a candidate word is selected for further processing may, for example, be based on a quantity of non-LRP errors within a candidate word relative to another quantity of non-LRP errors within another candidate word associated with a same pair of candidate words. Second selection field 810 may identify one or more selected candidate words that are selected for processing the encoded word and/or one or more other selected candidate words that are not selected for processing the encoded word and/or are to be discarded. Determination of whether a selected candidate word is selected for processing the encoded word may, for example, be based on whether a payload bit, associated with LRP 420 within a candidate word or another candidate word within a same pair of candidate words, is inverted.

By way of example, FEC device 130 may, for a first pair of candidate words, compare a first quantity of non-LRP errors (e.g., 2) for a first candidate word (e.g., associated with candidate word ID 00) to a second quantity of non-LRP errors (e.g., 2) for a second candidate word (e.g., associated with candidate word ID 01) (e.g., as shown by ellipse 812 of FIG. 8). FEC device 130 may also, or alternatively, determine that the first quantity and the second quantity are equal. When both candidate words have an equal quantity of non-LRP errors, FEC device 130 may select both candidate words for further processing by causing a first value (e.g., 1 or some other first value) to be stored in first selection field 805 associated with the first and second candidate words (e.g., as shown by ellipse 812).

Additionally, or alternatively, FEC device 130 may, for a second pair of candidate words, compare a third quantity of non-LRP errors (e.g., <2) for a third candidate word (e.g., associated with candidate word ID 02) to a fourth quantity of non-LRP errors (e.g., >2) for a fourth candidate word (e.g., associated with candidate word ID 03) (e.g., as shown by ellipse 814 of FIG. 8). FEC device 130 may also, or alternatively, determine that the fourth quantity is greater than the third quantity and may select the third candidate word, associated with the third quantity, for further processing. FEC device 130 may also, or alternatively, cause the first value (e.g., 1 or some other first value) to be stored in first selection field 805 associated with the third candidate word. FEC device 130 may not select the fourth candidate word, may discard the fourth candidate word, and/or may store a second value (e.g., 0 or some other second value) in first selection field 805 associated with the fourth candidate word (e.g., as shown by ellipse 814). Similarly, FEC device 130 may analyze other pairs of candidate words and may select and/or discard one or more candidate words based on respective quantities of non-LRP errors associated with candidate words (as shown by ellipses 816 and 818).

Additionally, or alternatively, in the example above, FEC device 130 may determine that the fourth quantity of non-LRP errors, within the fourth candidate word, is greater than an error threshold predetermined by FEC device 130. When the fourth quantity of LRP errors are greater than the error threshold, FEC device 130 may not select the fourth candidate word and/or may discard the fourth candidate word. Additionally, or alternatively, FEC device 130 may, thus, select the third candidate word provided that the third quantity of non-LRP errors is not greater than the error threshold.

As further shown in FIG. 7, process 700 may include identifying pairs of selected candidate words (block 720) and selecting, for each pair, a candidate word that does not include an inverted most reliable LRP (block 725). For example, FEC device 130 may identify selected candidate words based on the first value (e.g., 1, or some other first value) being stored in first selection field 805. FEC device 130 may also, or alternatively, identify pairs of the selected candidate words to analyze. FEC device 130 may, for example, identify a first pair of selected candidate words to compare the first candidate word (e.g., associated with candidate word ID 00 of FIG. 8) to the fourth candidate word (e.g., associated with candidate word ID 03 of FIG. 8). FEC device 130 may also, or alternatively, identify a second pair of selected candidate words to compare the second candidate word (e.g., associated with candidate word ID 01 of FIG. 8) to the third candidate word (e.g., associated with candidate word ID 02 of FIG. 8). FEC device 130 may also, or alternatively, identify a third pair of selected candidate words to compare the third candidate word to the second candidate word. FEC device 130 may also, or alternatively, identify other pairs of candidate words in a manner that permits all candidate words to be associated with a pair of candidate words.

Additionally, or alternatively, for the first pair of selected candidate words, FEC device 130 may determine whether a bit, corresponding to a most reliable LRP 420, has been inverted in the first candidate word or the fourth candidate word. For example, FEC device 130 may determine that first LRP field 610 of FIG. 8 stores information that indicates that a bit, within the first candidate word and that corresponds to the most reliable LRP 420, has not been inverted. Additionally, or alternatively, FEC device 130 may determine that first LRP field 610 of FIG. 8 stores information that indicates that a bit, within the fourth candidate word and that corresponds to the most reliable LRP 420, has been inverted. Based on the determination that the bit, associated with the most reliable LRP 420, has not been inverted within the first candidate word and has been inverted within the fourth candidate word, FEC device 130 may select the first candidate word with which to process the encoded word. FEC device 130 may store, in data structure 800, a first value (e.g., 1 or some other first value) indicating that the first candidate word is selected (e.g., as shown by ellipse 820 of FIG. 8).

Additionally, or alternatively, for the second pair of selected candidate words, FEC device 130 may determine that first LRP field 610 of FIG. 8 stores information that indicates that a bit, within the second candidate word and that corresponds to the most reliable LRP 420, has been inverted. Additionally, or alternatively, FEC device 130 may determine that first LRP field 610 of FIG. 8 stores information that indicates that a bit, within the third candidate word and that corresponds to the most reliable LRP 420, has not been inverted. Based on the determination that the bit, associated with the most reliable LRP 420, has been inverted within the second candidate word and has not been inverted within the third candidate word, FEC device 130 may not select second candidate word with which to process the encoded word. FEC device 130 may store, in data structure 800, a second value (e.g., 0 or some other second value) indicating that the second candidate word is not selected (e.g., as shown by ellipse 822 of FIG. 8). Additionally, or alternatively, based on the determination that the bit, associated with the most reliable LRP 420, has not been inverted, FEC device 130 may select the third candidate word with which to process the encoded word. FEC device 130 may store, in data structure 800, a first value (e.g., 1 or some other first value) indicating that the third candidate word is selected (e.g., as shown by ellipse 824 of FIG. 8). FEC device 130 may, in a manner similar to that described above, select and/or discard other candidate words (e.g., as shown by ellipse 826 of FIG. 8).

In an example where a pair of candidate words includes bits, associated with a most reliable LRP 420, that are both inverted or both not inverted, FEC device 130 may process the pair of candidate words using a next most reliable LRP 420 in a manner similar to that described above.

As further shown in FIG. 7, process 700 may include processing the encoded word based on the selected candidate words (block 730). For example, FEC device 130 may, using known soft forward error correction techniques, use the selected candidate words to identify a version of the encoded word that includes fewer errors than are included within the encoded word. FEC device 130 may also, or alternatively, process other encoded words, obtained from the block of samples, in a manner similar to that described above. FEC device 130 may also, or alternatively, continue to process the other encoded words until all of the encoded words, within the block of samples, have been processed.

Figure 9:
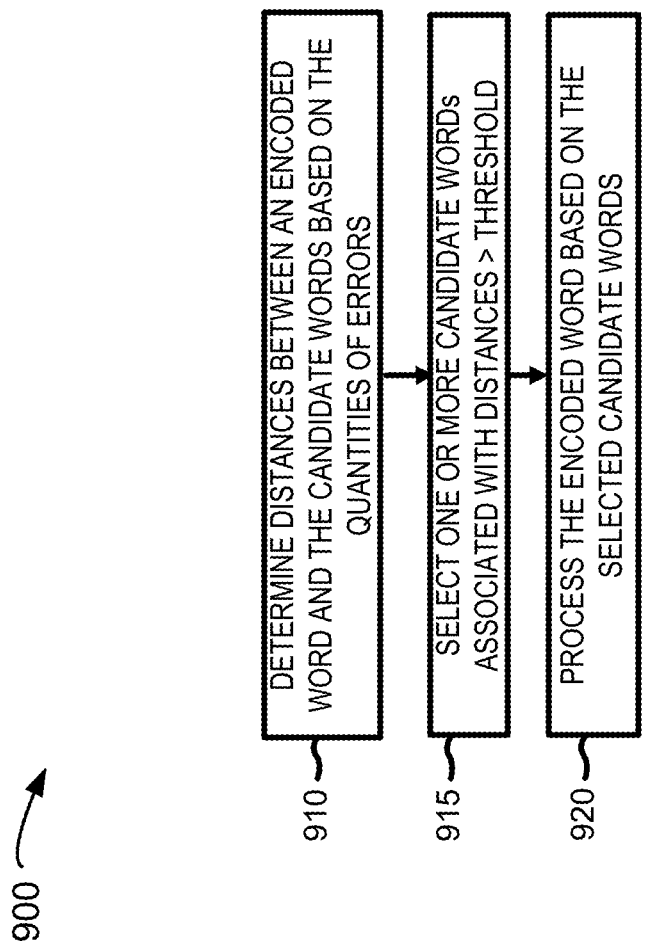
FIG. 9 is a flow chart an example process for reducing duplicate candidate words.

FIG. 9 is a flow chart an example process 900 for reducing duplicate candidate words. Process 900 may correspond to block 540 of FIG. 5 and/or block 730 of FIG. 7. In an example implementation, process 900 may be performed by FEC device 130. Additionally, or alternatively, some or all of process 900 may be performed by a device, or combination of devices, separate from, or in combination with, FEC device 130. FIG. 10 is a diagram of an example data structure 1000 that stores information identifying non-LRP error attributes associated with the candidate words. In the description below, some or all of process 900 will be described with references to data structure 1000 of FIG. 10.

Assume, in the description below and in a manner similar to that described above with respect to blocks 505 and 510 of FIG. 5, that FEC device 130 has obtained an encoded word from a block of samples and has identified one or more LRPs 420 associated with the encoded word. Assume further that FEC device 130 has, in a manner similar to that described above with respect to block 515 of FIG. 5, generated one or more candidate words based on the identified LRPs 420. Assume still further that FEC device 130 has, in a manner similar to that described above with respect to block 520 of FIG. 5, determined error attributes associated with each of the candidate words. The error attributes may, for example, identify a respective quantity of LRP errors and a respective copy of non-LRP errors within each of the candidate words. Assume also that FEC device 130 has, in a manner similar to that described above with respect to block 535 of FIG. 5 and/or block 725 of FIG. 7, selected candidate words with which to process the encoded word.

As shown in FIG. 9, process 900 may include determining distances between an encoded word and selected candidate words (block 910). For example, FEC device 130 may determine, on a bit by bit basis, distances (e.g., a Hamming distance, a Euclidean distance, etc.) between the selected candidate words and the encoded word. The distances may correspond to a quantity of bits, associated with the candidate words, that are different (e.g., inverted) than bits associated with the encoded word.

For example, as shown in FIG. 10, data structure 1000 may include a collection of fields, such as fields 605-630 (FIG. 6), a distance field 1005 and a selection field 1010. The quantity of fields within data structure 1000 is provided for explanatory purposes. In another example, data structure may include fewer fields, greater fields, different fields, or differently arranged fields that are shown in FIG. 10.

Distance field 1005 may store information that identifies a distance between a particular candidate word and an encoded word. Selection field 1010 may identify which of the candidate words are duplicates of another candidate word or the encoded word. For example, FEC device 130 may, on a bit-by-bit basis, determine distances (e.g., Hamming distances, Euclidean distances, etc.) between the candidate words and the encoded word based on a respective quantity of LRP errors and non-LRP errors. FEC device 130 may also, or alternatively, store values that correspond the distances in data structure 1000 (e.g., as shown by ellipse 1012 of FIG. 10).

In one example, FEC device 130 may determine that the first candidate word has no errors and may, thus, determine a first distance (e.g., 0), between the first candidate word and the encoded word, based on no errors (e.g., as shown by ellipse 1014 of FIG. 10). In another example, FEC device 130 may determine that the first candidate word has one non-LRP error and may, thus, determine the first distance (e.g., 1), based on the one error (e.g., as shown by ellipse 1014 of FIG. 10). FEC device 130 may also, or alternatively, determine a second distance (e.g., 1) between the second candidate word and the encoded word based on an inverted bit that corresponds to the first LRP 420 (e.g., as shown by ellipse 1016 of FIG. 10). Additionally, or alternatively, FEC device 130 may determine a third distance (e.g., 1) between the third candidate word and the encoded word based on an inverted bit that corresponds to the second LRP 420 (e.g., as shown by ellipse 1018 of FIG. 10). Similarly, FEC device 130 may determine a respective distance for each of the other candidate words based on a respective quantity of non-LRP errors (e.g., based on the inverted first, second, and/or third LRPs 420) and/or a respective quantity of non-LRP errors associated with each candidate word (e.g., as shown by ellipses 1020-1028 of FIG. 10).

As also shown in FIG. 9, process 900 may include selecting one or more candidate words associated with a distance that is greater than a threshold (block 915). For example, FEC device 120 may identify a threshold to be used to determine whether another candidate word is a duplicate of the first candidate word based on an error correcting capacity, per word, of FEC device 130. Assume, in the discussion below, that FEC device 130 is associated with an error correcting capacity of two non-LRP errors per word. Thus, a candidate word, associated with a distance that is not greater than the threshold that is based on the error correcting capacity, may be identified, by FEC device 130, as a duplicate of the first candidate word.

Additionally, or alternatively, FEC device 130 may determine that a candidate word associated with a distance that is less than the threshold is a duplicate candidate word. For example, FEC device 130 may determine that the second candidate word, the third candidate word, and the fifth candidate word are duplicates of the first candidate word based on the second distance (e.g., 1) and third distance (e.g., 1), respectively, being less than the threshold (e.g., 2). Additionally, or alternatively, FEC device 130 may determine that a fourth candidate word, a sixth candidate word, and/or a seventh candidate word are duplicates of the first candidate word based on a distance, between the encoded word and the fourth, sixth, and seventh candidate words (e.g., 2) being equal to the threshold. FEC device 130 may discard the candidate words associated with distances that are less than the threshold (e.g., second candidate word-seventh candidate word). Additionally, or alternatively, FEC device 130 may store, in data structure 1000, an indication that the candidate words are duplicates of the first candidate word (e.g., as shown by ellipse 1030).

Additionally, or alternatively, FEC device 130 may determine that an eighth distance (e.g., >2) between the eight candidate word and the encoded word is greater than the threshold based on the LRP errors (e.g., 3) and non-LRP errors (e.g., 2) (e.g., as shown by ellipse 1028 of FIG. 10). FEC device 130 may select the eighth candidate word based on a determination that the eighth distance is greater than the threshold. Additionally, or alternatively FEC device may store an indication (e.g., 1) that indicates that the eighth candidate word has been selected (e.g., as shown by ellipse 1030 of FIG. 10).

As further shown in FIG. 9, process 900 may include processing the encoded word based on the selected candidate words (block 920). For example, FEC device 130 may, using known soft forward error correction techniques, use the selected candidate words (e.g., the first and/or eighth candidate words) to identify a version of the encoded word that includes fewer errors than are included within the encoded word. FEC device 130 may also, or alternatively, process other encoded words, obtained from the block of samples, in a manner similar to that described above. FEC device 130 may also, or alternatively, continue to process the other encoded words until all of the encoded words, within the block of samples, have been processed.

Systems and/or methods, described herein, may allow a FEC device to perform a soft iterative forward error correction on an encoded word, within traffic, using a quantity of candidate words. The FEC device may perform an operation that reduces the quantity of candidate words used to process the encoded word without reducing a quantity of errors that can be corrected by the FEC device. Reducing the quantity of candidate words may allow the FEC device to correct a same quantity of errors, as a traditional FEC device, at a reduced level of complexity and/or expense.

The foregoing description provides illustration and description, but is not intended to be exhaustive or to limit the implementations to the precise form disclosed. Modifications and variations are possible in light of the above disclosure or may be acquired from practice of the implementations.

For example, while series of blocks have been described with regard to FIGS. 5, 7, and 9, the order of the blocks may be changed in other implementations. Also, non-dependent blocks may be performed in parallel.

Furthermore, while the disclosed embodiments have been presented as generally suitable for use in an optical network, the systems and methods disclosed herein are suitable for any fiber optic network, fiber network, fiber line, or link that includes one or more transmission spans, amplifier spans, or hops.

Even though particular combinations of features are recited in the claims and/or disclosed in the specification, these combinations are not intended to limit the disclosure of the implementations. In fact, many of these features may be combined in ways not specifically recited in the claims and/or disclosed in the specification. Although each dependent claim listed below may directly depend on only one other claim, the disclosure of the implementations includes each dependent claim in combination with every other claim in the claim set.

It will be apparent that embodiments, as described herein, may be implemented in many different forms of software, firmware, and hardware in the embodiments illustrated in the figures. The actual software code or specialized control hardware used to implement embodiments described herein is not limiting of the embodiments. Thus, the operation and behavior of the embodiments were described without reference to the specific software code—it being understood that software and control hardware may be designed to implement the embodiments based on the description herein.

No element, act, or instruction used in the present application should be construed as critical or essential to the implementation unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A system comprising:
   one or more devices to:
   receive a word, of a block of words within traffic, on which to perform forward error correction, each word of the block of words including respective encoded bits and respective sets of reliability bits for identifying a respective level of reliability of each one of the respective encoded bits,
   identify, within the word, least reliable positions that correspond to a subset of encoded bits associated with one or more lowest levels of reliability;
   generate a set of candidate words based on different combinations in which the subset of encoded bits can be inverted;
   determine a first quantity of errors associated with a first candidate word of the set of candidate words and a second quantity of errors associated with a second candidate word of the set of candidate words,
   determine whether the first quantity of errors or the second quantity of errors corresponds to an odd value,
   invert a parity bit, associated with the second candidate word, when the second quantity of errors corresponds to the odd value,
   determine, based on inverting the parity bit, whether a first bit or a second bit is inverted, the first bit being most reliable among the subset of encoded bits within the first candidate word, and the second bit being most reliable among the subset of encoded bits within the second candidate word,
   select the first candidate word when the second bit is inverted, and
   perform forward error correction on the word, using the first candidate word, based on the selection of the first candidate word.

2. The system of claim 1, where, when determining the first quantity of errors and the second quantity of errors, the one or more devices are further to:
   decode the first candidate word to identify the first quantity of errors associated with the first candidate word, and
   decode the second candidate word to identify the second quantity of errors associated with the second candidate word.

3. The system of claim 1, where, when determining the first quantity of errors and the second quantity of errors, the one or more devices are further to:
   identify one or more first errors, within the first candidate word, that correspond to one or more first inverted bits, within the subset of encoded bits, associated with the first candidate word,
   identify one or more second errors, within the first candidate word, that are not related to the one or more first inverted bits,
   identify one or more third errors, within the second candidate word, that correspond to one or more second inverted bits, within the subset of encoded bits, associated with the second candidate word,
   identify one or more fourth errors, within the first candidate word, that are not related to the one or more second inverted bits,
   determine the first quantity of errors based on the one or more first errors and the one or more second errors, and
   determine the second quantity of errors based on the one or more third errors and the one or more fourth errors.

4. The system of claim 3, where the one or more devices are further to:
   determine that a quantity associated with the one or more third errors is greater than a threshold, and
   select the first candidate word based on the determination that the quantity associated with the one or more third errors is greater than the threshold.

5. The system of claim 3, where the one or more devices are further to:
   determine whether a quantity, associated with the one or more second errors, is less than a quantity associated with the one or more fourth errors,
   select the first candidate word when the quantity associated with the one or more second errors is less than the quantity associated with the one or more fourth errors,
   determine, based on the selection of the first candidate word, whether the first bit or a third bit is inverted, the third bit being most reliable among the subset of encoded bits within a third candidate word of the set of candidate words,
   select the first candidate word when the first bit is not inverted and when the third bit is inverted, and
   select the third candidate word when the third bit is not inverted and when the first bit is inverted.

6. The system of claim 1, where the one or more devices are further to:
   invert another parity bit, associated with the first candidate word, when the first quantity of errors corresponds to the odd value,
   determine, based on inverting the other parity bit, whether the first bit or the second bit is inverted,
   select the second candidate word when the second bit is inverted, and perform forward error correction on the word using the second candidate word based on the selection of the second candidate word.

7. The system of claim 1, where the one or more devices are further to:
generate a first distance between the first candidate word and the first word,
the first candidate word including no inverted bits within the subset of encoded bits associated with the first word, and
the first distance being less than a threshold that corresponds to an error correcting capacity of the system,
generate a second distance between the second candidate word and the first word,
determine whether the second distance is greater than the threshold, and
perform forward error correction on the word using the first candidate word when the second distance is greater than the threshold, or
perform forward error correction on the word using the first candidate word or the second candidate word when the second distance is not greater than the threshold.

8. A method comprising:
receiving, from an optical receiver and by a device, a word, of a block of words within traffic, on which to perform forward error correction, each word of the block of words including respective encoded bits and respective sets of reliability bits for identifying a respective level of reliability of each one of the respective encoded bits;
identifying, by the device, least reliable positions, within the word, that correspond to a subset of encoded bits, within the word, associated with one or more lowest levels of reliability;
generating, by the device, a set of candidate words based on different combinations in which the subset of encoded bits can be inverted;
identifying, by the device, a first pair of candidate words, within the set of candidate words, the first pair including a first word and a second word,
the first word including a first bit, the first bit not being an inverted bit and being most reliable within the subset of encoded bits associated with the first word;
identifying, by the device, a first quantity of errors associated with the first word and a second quantity of errors associated with the second word;
determining, by the device, whether the first quantity of errors is greater than the second quantity of errors;
selecting, by the device, the first word when the first quantity of errors is not greater than the second quantity of errors;
identifying, by the device, a second pair of candidate words, within selected words of the set of candidate words, the second pair including the first word and a third word,
the third word including a second bit that is most reliable within the subset of encoded bits associated with the third word;
determining, by the device, whether the second bit is an inverted bit;
selecting, by the device, the first word when the second bit is an inverted bit; and
performing, by the device, forward error correction on the word based on the selected first word.

9. The method of claim 8, where the second word includes a first bit that does not match a second bit, within the first word, to which the first bit corresponds, the first bit corresponding to one of the least reliable positions.

10. The method of claim 8, further comprising:
determining that the second bit is not an inverted bit,
identifying a third bit that is a next most reliable bit within the set of encoded bits associated with the first word, the third bit not being an inverted bit;
identifying a fourth bit that is a next most reliable bit within the set of encoded bits associated with the third word;
determining whether the fourth bit is an inverted bit; and
performing forward error correction, on the word, using the first word when the fourth bit is an inverted bit.

11. The method of claim 8, further comprising:
identifying a distance between a fourth word, of the set of candidate words, and the first word; and
discarding the fourth word based on a determination that the distance is based on a difference in inverted bits between the subset of encoded bits associated with the first word and a subset of encoded bits associated with the fourth word.

12. The method of claim 8, where identifying the first quantity of errors and the second quantity of errors further includes:
determining first errors associated with the second word and second errors associated with the second word,
the first errors corresponding to one or more inverted bits within the subset of encoded bits associated with the second word, and
the second errors corresponding to one or more errors that do not correspond to the one or more inverted bits;
determining whether a quantity associated with the second errors is greater than an error correction capacity associated with the device; and
discarding the second word when the quantity, associated with the second errors, is greater than the error correction capacity.

13. The method of claim 12, where determining the first errors and the second errors further includes:
decoding the second word to identify the second errors.

14. The method of claim 8, further comprising:
inverting another parity bit, associated with the first word, based on a determination that the first quantity of errors corresponds to the odd value; and
selecting the second word based on inverting the other parity bit; and
performing forward error correction on the word using the second word based on the selection of the second word.

15. A device comprising:
one or more components to:
receive a word, of a block of words within traffic, on which to perform forward error correction, each word of the block of words including respective encoded bits and respective sets of reliability bits for identifying a respective level of reliability of each one of the respective encoded bits,
identify, within the word, least reliable positions that correspond to a subset of encoded bits associated with one or more lowest levels of reliability,
generate a set of candidate words based on different combinations in which the subset of encoded bits can be inverted,
identify a first pair of words of the set of candidate words, the first pair including a first candidate word and a second candidate word, the first candidate word including a most reliable bit, of the subset of encoded bits associated with the first candidate word, that is not inverted,
identify a quantity of errors associated with the first candidate word, determine whether the quantity of errors corresponds to an odd value, invert a parity bit associated with the first candidate word when the quantity of errors corresponds to the odd value, select the second candidate word when the parity bit, associated with the first candidate word is inverted, and perform forward error correction, on the word using the second candidate word based on selection of the second candidate word.

16. The device of claim 15, where, when determining the quantity of errors, the one or more components are further to:

determine the quantity of errors based on a quantity of inverted bits within the subset of encoded bits associated with the first word and a quantity of errors identified by decoding the first candidate word, discard the first word when the quantity of errors identified by decoding the first candidate word, is greater than a threshold, and perform forward error correction on the word, using the second word, when the first word is discarded.

17. The device of claim 15, where the one or more components are further to:

determine a quantity of errors associated with the second candidate word, discard the second candidate word based on a determination that the quantity of errors, associated with the second candidate word, is greater than a threshold, and perform forward error correction on the word, using the first candidate word, when the second candidate word is discarded.

18. The device of claim 15, where the one or more components are further to:

generate a first distance between the first candidate word and the word, generate a second distance between the second candidate word and the word, determine whether a difference between the first distance and the second distance is greater than a threshold, the threshold being based on a quantity of errors, per word, that the device can correct, discard the second candidate word when the difference between the first distance and second distance is not greater than the threshold, and perform forward error correction on the word, using the first candidate word, when the second candidate word is discarded.

19. The device of claim 15, where the one or more components are further to:

generate a first distance between the first candidate word and the word, generate a second distance between the second candidate word and the word, determine whether a difference between the first distance and the second distance is greater than a threshold, the threshold being based on a quantity of errors, per word, that the device can correct, and perform forward error correction on the word using the first candidate word or the second candidate word when the difference between the first distance and the second distance is greater than the threshold.

20. The device of claim 19, where the first distance or second distance is determined on a bit-by-bit basis.

* * * * *